Figure 1:
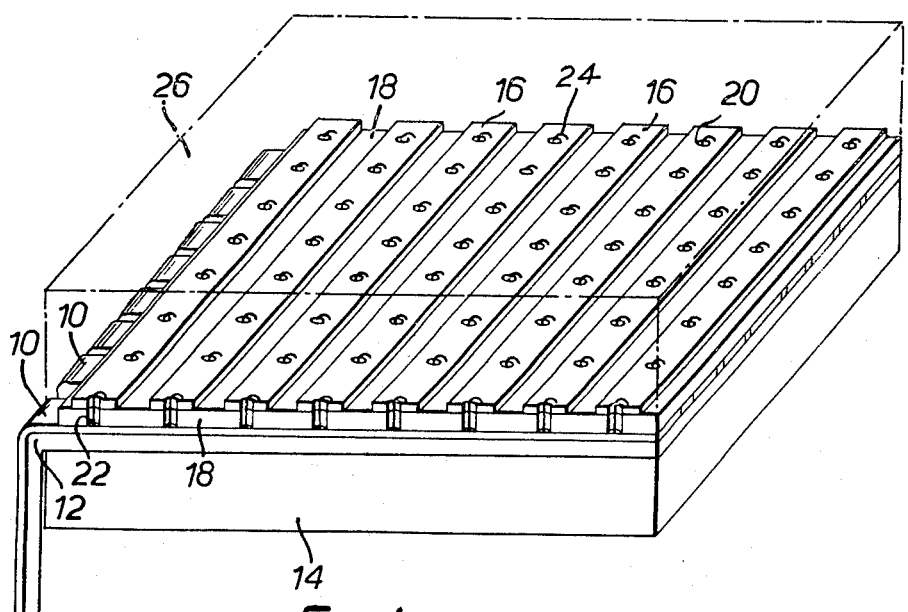

United States Patent [19]
Wisbey

[11] 3,950,844
[45] Apr. 20, 1976

[54] METHOD OF MAKING L.E.D. ARRAYS

[75] Inventor: Philip Henry Wisbey, Colchester, England

[73] Assignee: The Marconi Company Limited, Chelmsford, England

[22] Filed: Dec. 19, 1974

[21] Appl. No.: 534,647

[30] Foreign Application Priority Data
Dec. 21, 1973 United Kingdom............... 59445/73

[52] U.S. Cl.................................. 29/577; 29/588; 29/627; 313/500; 313/512; 357/17; 357/78
[51] Int. Cl.²................... H01L 21/00; H01L 27/00
[58] Field of Search ............. 29/577, 588, 589, 625, 29/626, 627, 25.16, 25.13; 339/18, 17 C; 313/500, 505, 512; 316/4, 11, 19, 20; 317/101 C, 101 CC, 101 CM, 101 CE, 101 F; 174/68.5

[56] References Cited
UNITED STATES PATENTS

| | | |
|---|---|---|
| 3,512,041 | 5/1970 | Dalmasso.......................... 357/17 X |
| 3,641,390 | 2/1972 | Nakamura ....................... 313/500 X |
| 3,670,205 | 6/1972 | Dixon et al................... 317/101 CE |
| 3,697,666 | 10/1972 | Wakley et al..................... 357/14 X |
| 3,743,890 | 7/1973 | Ney........................................ 357/76 |
| 3,763,405 | 10/1973 | Mitsuhata ............................. 357/17 |
| 3,793,064 | 2/1974 | Budd et al. ........................ 29/627 X |

Primary Examiner—Victor A. DiPalma
Attorney, Agent, or Firm—Baldwin, Wight & Brown

[57] ABSTRACT

A method of manufacturing an array of light emitting diodes in which a first insulating sheet carrying a first set of mutually isolated conductors is bonded to a sheet of thermally conductive material, a second, perforated, sheet carrying a second set of mutually isolated conductors is bonded to the first insulating sheet with the perforations overlying the conductors of the first sheet and the two sets of conductors crossing one another, light emitting diodes are placed in the perforations to contact each with one electrode a conductor of the first set and the other electrode of each diode is electrically connected to a conductor of the second set.

12 Claims, 2 Drawing Figures

U.S. Patent   April 20, 1976   3,950,844

METHOD OF MAKING L.E.D. ARRAYS

This invention relates to arrays of light emitting diodes (L.E.D.'s) and to improved methods of manufacturing such arrays.

According to the present invention, in manufacturing an array of light emitting diodes in which a first insulating sheet carrying a first set of mutually isolated conductors is bonded to a sheet of thermally conductive material, a second, perforated, sheet carrying a second set of mutually isolated conductors is bonded to the first sheet with the perforations overlying the conductors of the first sheet and the two sets of conductors crossing one another, light emitting diodes are placed in the perforations to contact each with one electrode a conductor of first set and the other electrode of each diode is electrically connected to a conductor of the second set.

The insulating sheets carrying sets of conductors are printed circuit boards, consisting of copper clad glass/epoxy laminates so that bonding may be affected by the application of temperature and pressure. The use of printed circuit boards also results in there being no limit to the size of the array.

Preferably, the sheet of thermally conductive material is of copper so as to enable rapid heat dissipation whilst offering mechanical support for the array.

It is an important aspect of the manufacturing method of the present invention that individual light emitting diodes may be tested and replaced at any stage of manufacture so that the yield of arrays should not be severely affected by the finite probability of any individual diode failing.

In order to protect the diodes against mechanical shock inter alia, it is advantageous to encapsulate the array in an epoxy resin or other transparent material capable of being moulded around the array.

As there is a possibility of a diode failing because of the encapsulation process it is preferable to be able to replace individual diodes even after encapsulation. This is achieved, in accordance with a further feature of the invention, by utilizing conductors of substantial thickness. Provided that the thickness of the conductors is sufficient to withstand resurfacing by machining, it is possible to drill into the encapsulated array to remove the faulty diode and subsequently to resurface the conductors using an end mill, to enable mounting of a new diode.

It should be mentioned that in certain applications it may be preferable to use an encapsulation in inert gas under a cover of glass or other transparent material in place of the epoxy resin encapsulation.

It is advantageous in producing a large area display to adopt a modular approach, that is to say to use display modules which may be placed adjacent one another to provide a larger area display. The approach has the advantage of enabling a user to increase the size of a display as his requirements become exigent. However, there then arises the problem of preventing the connections to the sets of conductors from interfering with the mounting of the display modules contiguously.

In order to overcome this difficulty, the sheets carrying the sets of conductors are of a material such as KAPTON (R.T.M.) which is capable of being folded on a small radius without cracking or snapping. The sheets may then be folded over the edge of the thermally conductive support sheet and access made to them is at the back of the array.

Figure 2:
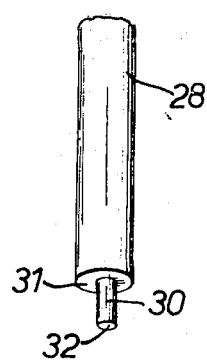

The invention will now be described further, by way of example, with reference to the accompanying drawings, in which:

FIG. 1 is a sectioned perspective view of an array of LED's constructed in accordance with the invention, FIG. 2 shows a tool for enabling a diode in an encapsulated array of LED's to be replaced.

In manufacturing an array of LED's a printed circuit board formed of metal strip conductors 10 on a flexible sheet of Kapton 12 is bonded to a copper sheet 14 serving as a heat sink. At the edge of the copper sheet 14 the Kapton sheet 12 is tightly folded over so that the strip conductors 10 extend laterally only slightly beyond the edge of the copper sheet 14.

A further printed circuit board, generally similar to that already described and having strip conductors 16 carried by a Kapton sheet 18, is bonded to the lower printed circuit board. Prior to bonding to the lower printed circuit board, the upper printed circuit board is perforated with holes 20 which pass through the strip conductors 16. A light emitting diode 22 is placed in each hole 20 and one of its electrodes is bonded by means of a conductive glue, such as a silver powder loaded epoxy resin, to the conductive strips 10 of the lower printed circuit board. The other electrode of each light emitting diode is connected to a conductor of the upper printed circuit board, by means of a soldered filament 24.

The array consisting of the circuit boards bonded to the copper sheet 14 is then covered with an epoxy resin 26 to encapsulate the light emitting diode 22. If during the course of encapsulation one of the filaments 24 should break or for some other reason a light emitting diode fail to operate that diode can be replaced by drilling down through the layer of epoxy resin into the hole in which the diode is inserted utilising an end mill as shown in FIG. 2. The mill 28 has a reduced diameter portion 30 at its end, whose axial length corresponds to the distance between the conductive strips of the printed circuit boards. The end surfaces 31 and 32 of the mill are abrasive and after the faulty diode has been eroded the surfaces of the conductive strips are ground so as to be capable of receiving a new diode. After replacement of the diode the hole in the encapsulation is made good by further moulding of epoxy resin.

It will be clear from the foregoing description that a faulty light emitting diode can be replaced at any stage in manufacture and that the construction shown in FIG. 1 readily lends itself to the use of the array as a module in a larger display since a similar array may be placed adjacent that of FIG. 1 whilst still maintaining a regular spacing of the light emitting diodes across the display area. The access to any diode in the assembled display panel is achieved by means of the portions of the strip conductors on the parts of the printed circuit boards which are folded over the edge of the copper heat sink towards the back of the display panel.

I claim:

1. A method of manufacturing an array of light omitting diodes which comprises the steps of bonding a first insulating sheet carrying a first set of mutually isolated conductors to a sheet of thermally conductive material, bonding, a second, perforated sheet carrying a second set of mutually isolated conductors to the first insulating sheet with the perforations overlying the conductors of the first sheet and the two sets of conductors crossing one another, positioning light emitting diodes in the perforations and effecting electrical contact between one electrode of each diode and a conductor of the first set and between the other electrode of each diode and a conductor of the second set.

2. A method as claimed in claim 1, in which the insulating sheets carrying sets of conductors are printed circuit boards, consisting of copper clad glass/epoxy laminates so that the bonding therebetween may be effected by the application of temperature and pressure.

3. A method as claimed in claim 1, in which the sheet of thermally conductive material is of copper.

4. A method as claimed in claim 1, including the step of encapsulating the array in an epoxy resin or other transparent material capable of being moulded around the array.

5. A method as claimed in claim 1, including the steps of covering the array with a sheet of transparent material defining an intervening space with the array, and then filling the intervening space with an inert gas.

6. A method as claimed in claim 1, in which the conductors are of such a thickness as to be capable of withstanding resurfacing by machining.

7. A method as claimed in claim 1 in which the sheet carrying the sets of conductors is of a material which is capable of being folded on a small radius without cracking or snapping.

8. A method of manufacturing an array of light emitting diodes which comprises the steps of:
   a. providing a first insulating sheet which has spaced, parallel conductors on one side thereof;
   b. providing a second insulating sheet which has spaced, parallel conductors on one side thereof;
   c. forming perforations through said second sheet through each conductor of said second sheet at regular intervals corresponding to the spacing between the conductors of the first sheet;
   d. bonding said first sheet to a thermally conductive sheet wherein that side of the first sheet opposite said one side thereof is in face-to-face contact with said thermally conductive sheet;
   e. positioning that side of said second sheet which is opposite said one side thereof in face-to-face contact with said one side of the first sheet, with the conductors of the first and second sheets being disposed in crossing relation and with said perforations being aligned with the conductors of said first sheet, and bonding said first and second sheets together in such orientation; and
   f. positioning a light emitting diode in each perforation with one electrode thereof in electrical contact with a conductor of said first sheet and electrically connecting another electrode of each such diode to that conductor of the second sheet which contains the perforation corresponding to such diode.

9. A method as defined in claim 8 wherein said sheet of thermally conductive material is a copper plate and said first and second sheets are printed circuit boards.

10. A method as defined in claim 9 including the step of bending one edge of said first sheet over said thermally conducting sheet, said one edge containing the ends of all of said conductors on the first sheet.

11. A method as defined in claim 8 including the step of bending one edge of said first sheet over said thermally conducting sheet, said one edge containing the ends of all of said conductors on the first sheet.

12. A method as defined in claim 8 including the step of covering said one side of the second sheet with a layer of transparent, synthetic resin material.

* * * * *